United States Patent [19]
Ito et al.

[11] Patent Number: 4,591,895
[45] Date of Patent: May 27, 1986

[54] CMOS CIRCUIT WITH SEPARATE POWER LINES TO SUPPRESS LATCHUP

[75] Inventors: Akihiko Ito; Tadahiro Saito, both of Kawasaki, Japan

[73] Assignee: Fujitsu Limited, Kawasaki, Japan

[21] Appl. No.: 785,040

[22] Filed: Oct. 8, 1985

Related U.S. Application Data

[63] Continuation of Ser. No. 463,896, Feb. 4, 1983, abandoned, which is a continuation of Ser. No. 171,275, Jul. 23, 1980, abandoned.

[30] Foreign Application Priority Data

Jul. 29, 1979 [JP] Japan .................................. 54-93992

[51] Int. Cl.[4] ............................................ H01L 27/02
[52] U.S. Cl. ......................................... 357/42; 357/43; 357/51; 357/68
[58] Field of Search ...................... 357/42, 51, 68, 43

[56] References Cited

U.S. PATENT DOCUMENTS

| | | | |
|---|---|---|---|
| 3,702,943 | 11/1972 | Heuner et al. | 357/42 |
| 3,946,424 | 3/1976 | Tarui et al. | 357/42 |
| 3,955,210 | 5/1976 | Bhatia et al. | 357/42 |
| 4,053,798 | 10/1977 | Koike et al. | 357/42 |
| 4,062,039 | 12/1977 | Nishimura | 357/42 |
| 4,223,337 | 9/1980 | Kojima et al. | 357/68 |
| 4,233,672 | 11/1980 | Suzuki et al. | 357/42 |
| 4,273,805 | 6/1981 | Dawson et al. | 357/42 |
| 4,300,061 | 11/1981 | Mihalich et al. | 357/42 |

OTHER PUBLICATIONS

Suzuki et al., "A New Single-Chip C[2]MOS A/D Converter for Microprocessor Systems-Penta-Phase Integrating C[2]MOS A/D Converter, *IEEE Journal of Solid-State Circuits*, vol. SC-13, No. 6, Dec., 1978, pp. 779-785.

*Primary Examiner*—Joseph E. Clawson, Jr.
*Attorney, Agent, or Firm*—Staas & Halsey

[57] ABSTRACT

A semiconductor device including a plurality of CMOS (Complementary Metal Oxide Semiconductor) elements, each comprised of a conventional source region, a drain region, and a diffusion region located adjacent to source and drain elements, and each driven by a power source. A first conductor and a second conductor, which are newly introduced in the present device, are physically independent from each other. The first conductor is connected between the power source and the source region. The second conductor is connected between the power source and the diffusion region.

5 Claims, 9 Drawing Figures

CMOS CIRCUIT WITH SEPARATE POWER LINES TO SUPPRESS LATCHUP

This is a continuation of co-pending application Ser. No. 463,896 filed on Feb. 4, 1983, which is a continuation of Ser. No. 171,275 filed on July 23, 1980, both now abandoned.

BACKGROUND OF THE INVENTION

The present invention relates to a semiconductor device, and more particularly relates to a CMOS (Complementary Metal Oxide Semiconductor) device.

Generally, CMOS elements for fabricating a desired digital circuit and CMOS elements for fabricating a desired analogue circuit are formed in respective different silicon chips, which are electrically and physically independent from each other. However, in recent years, CMOS elements for fabricating both desired digital and analogue circuits, have been formed in the same single silicon chip, in order to increase a package density. For example, a coding and decoding apparatus, that is a so-called CODEC (coder and decoder), is usually fabricated by both digital and analogue CMOS devices which are formed in a single silicon chip. In such a digital and analogue CMOS device, it is a well known defect that undesired electric noise signals are induced in the analogue CMOS elements. The electric noise signals are created due to the occurrence of a sharp rising edge or a sharp falling edge of each rectangular pulse signal generated in the digital CMOS elements. In the prior art, the digital CMOS elements and the analogue CMOS elements are not arranged, on the same silicon chip, at random, but are arranged in different respective digital and an analogue areas thereon, so as to decrease the induction coupling of the electric noise signals into the analogue CMOS elements. However, it is very difficult to almost completely suppress the inductive coupling of the electric noise signals.

SUMMARY OF THE INVENTION

Therefore, it is an object of the present invention to provide a CMOS device, including both digital and analogue CMOS elements therein, wherein less electric noise can be induced in the analogue CMOS elements.

A first conductor and a second conductor, which are newly introduced in the present device, are physically independent from each other. The first conductor is connected between the power source and the source region. The second conductor is connected between the power source and the diffusion region.

BRIEF DESCRIPTION OF THE DRAWINGS

The present invention will be more apparent from the ensuing description with reference to the accompanying drawings wherein.

DESCRIPTION OF THE PREFERRED EMBODIMENTS

Figure 1:
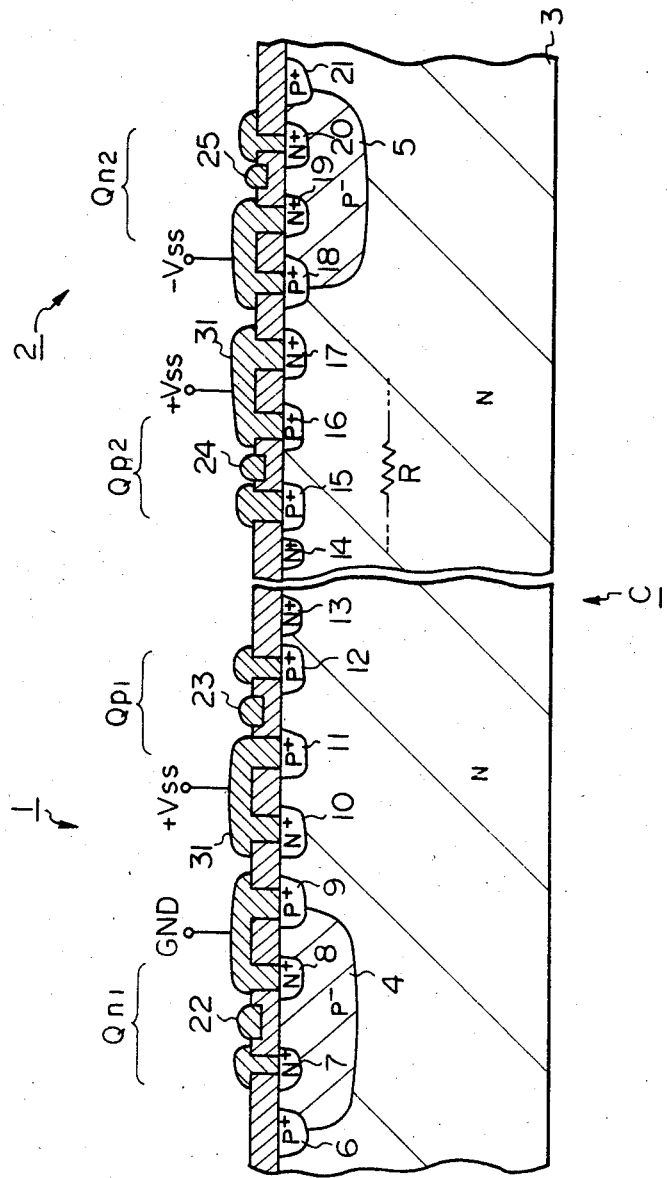
FIG. 1 depicts a cross-sectional partial view of a CMOS device of the prior art.

In FIG. 1, which depicts a cross-sectional partial view of a CMOS device, a single silicon chip C is fabricated with both a digital circuit area 1 and an analogue circuit area 2 therein. The digital circuit area 1 includes therein a great number of CMOS elements, that is digital CMOS elements, while the analogue circuit area 2 includes therein a great number of CMOS elements, that is analogue CMOS elements. However, in this Figure, only one digital CMOS element and also only one analogue CMOS element are illustrated, for the purpose of easy comprehension of the CMOS device. The digital CMOS element is comprised of both an N-channel transistor $Q_{n1}$ and a P-channel transistor $Q_{p1}$. Also, the analogue CMOS element is comprised of both an N-channel transistor $Q_{n2}$ and a P-channel transistor $Q_{p2}$. These transistors $Q_{n1}$, $Q_{p1}$, $Q_{n2}$ and $Q_{p2}$ are formed in and on a bulk, such as an N-type substrate 3. Especially, the transistors $Q_{n1}$ and $Q_{n2}$ are, respectively, formed in and on a bulk, such as P$^-$-well 4 and P$^-$-well 5. The transistor $Q_{n1}$ is comprised of an N$^+$-type drain region 7, an N$^+$-type source region 8 and a gate electrode 22. The transistor $Q_{p1}$ is comprised of a P$^+$-type source region 11 and a P$^+$-type drain region 12 and a gate electrode 23. The transistor $Q_{p2}$ is comprised of a P$^+$-type drain region 15, a P$^+$-type source region 16 and a gate electrode 24. The transistor $Q_{n2}$ is comprised of an N$^+$-type source region 19, an N$^+$-type drain region 20 and a gate electrode 25.

The N-channel transistor $Q_{n1}$ is surrounded by P$^+$-type diffusion regions 6 and 9. The P-channel transistor $Q_{p1}$ is surrounded by N$^+$-type diffusion regions 10 and 13. Similarly, the P-channel transistor $Q_{p2}$ is surrounded by N$^+$-type diffusion regions 14 and 17, and the N-channel transistor $Q_{n2}$ is surrounded by P$^+$-type diffusion regions 18 and 21. These diffusion regions 6, 9, 10, 13, 14, 17, 18 and 21 are useful for suppressing the creation of a so-called latchup phenomenon. As known, latchup phenomenon is derived from a so-called thyristor effect which is usually caused by both a parasitic NPN transistor and a parasitic PNP transistor, which are usually formed in a semiconductor device having a CMOS structure.

Further, in FIG. 1, each of the hatched areas atop the substrate 3, in which hatching lines are inclined from the right at the top to the left at the bottom, represents a conductor layer, such as aluminium. Each of the hatched areas atop the substrate 3, in which hatching lines are inclined from the left at the top to the right at the bottom, represents an insulation layer, such as silicon dioxide ($SiO_2$). It should be understood that a conventional protective layer, such as phospho-silicate glass (PSG), to be applied over the top surface of the CMOS device is not illustrated. Further, although the digital circuit area 1 is driven by the power sources +Vss and GND (ground), the analogue circuit area 2 is driven by the power sources +Vss and −Vss so as to produce a high analogue power.

Figure 2A:
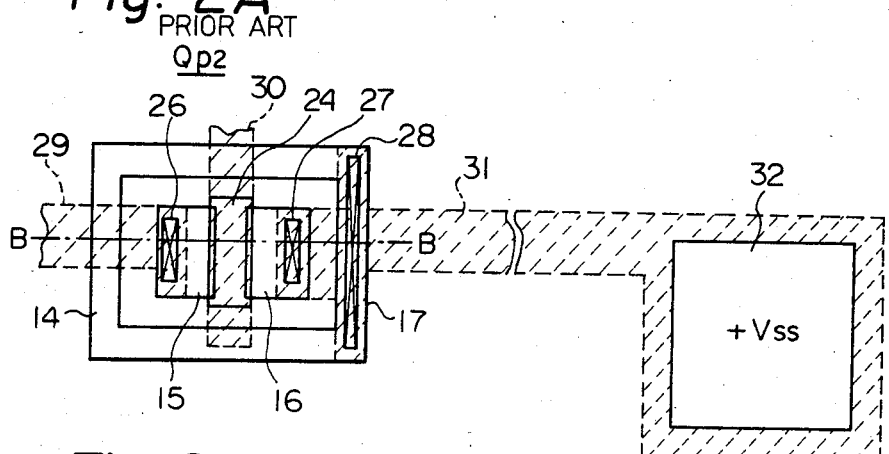
FIG. 2A depicts a plan view of a P-channel transistor $Q_{p2}$ shown in FIG. 1 and its peripheral member.
Figure 2B:
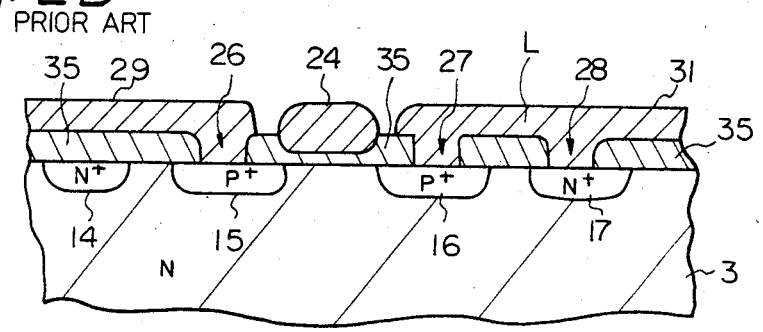
FIG. 2B is a cross-sectional view taken along a line B—B shown in FIG. 2A.
Figure 2C:
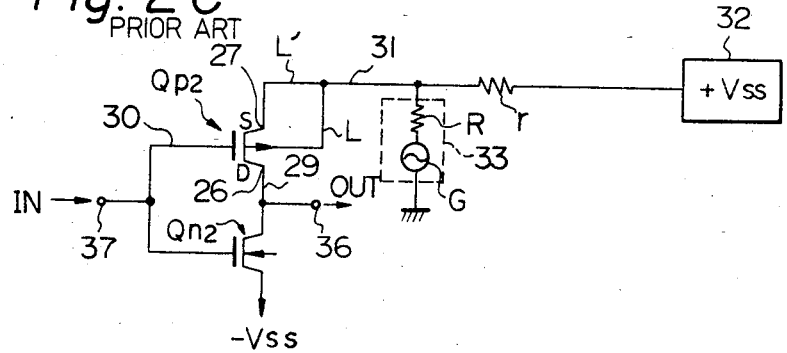
FIG. 2C is an equivalent circuit diagram of members shown in FIG. 2A and an N-channel transistor $Q_{n2}$ shown in FIG. 1.

As previously mentioned, in a CMOS device having a structure as shown in FIG. 1, undesired electric noise signals are induced in the analogue circuit area 2. The reason for this will be clarified with reference to FIGS. 2A, 2B and 2C. FIG. 2A depicts a plan view of the P-channel transistor $Q_{p2}$ shown in FIG. 1 and its peripheral member. FIG. 2B is a cross-sectional view taken along a line B—B shown in FIG. 2A. FIG. 2C is an equivalent circuit diagram of members shown in FIG. 2A and a N-channel transistor $Q_{n2}$ shown in FIG. 1. In these Figures, the member represented by the same reference numerals or symbols as those used in FIG. 1 remain the same. Referring to FIGS. 2A, 2B and 2C, a drain contact window 26 is formed in an insulation layer 35 atop the P+-type drain region 15. A source contact window 27 is formed in the insulation layer 35 atop the P+-type source region 16. Another contact window 28 is formed in the insulation layer 35 atop the N+-type diffusion region 17. The region 17 and the N+-type diffusion region 14 are useful, as previously explained, for suppressing the latchup phenomenon. That is, these regions are located in the neighbourhood of the transistor $Q_{p2}$ and apply a predetermined voltage, for example a voltage of a power source (+Vss), to the semiconductor substrate 3. Since the latchup phenomenon is commonly known by persons skilled in the art, details thereof are not mentioned. A drain conductor 29, such as aluminum, is distributed between the P+-type drain region 15 (via the window 26) and the transistor $Q_{n2}$ (via an analogue output terminal 36. A gate conductor 30, such as aluminum or polysilicon, is connected, on one hand, to the gate electrode 24 and, on the other hand, to an analogue input terminal 37. A conductor 31 is distributed between the P+-type source region 16 (via the source contact window 27) and a bonding pad 32 to which the power supply voltage (+Vss) is applied (no power source is illustrated in any of the accompanying figures). In FIG. 2C, the symbol γ represents a resistive component of the conductor 31. The symbol L represents an electrical connection between the P+-type source region 16 (FIG. 2B) and the N+-type diffusion region 17 (FIG. 2B). Accordingly, this connection L is the same as an area L shown in FIG. 2B. A reference numeral 33 schematically represents a source of electric noise signals.

Details of the noise source 33 of FIG. 2C will be mentioned below. Returning to FIG. 1 again, when the P-channel transistor $Q_{p1}$ becomes ON or OFF (accordingly the N-channel transistor $Q_{n1}$ becomes OFF or ON respectively), so as to create successive rectangular pulse signals, spike pulse currents are generated every time the falling edge of each of the rectangular pulse signals is produced. The spike pulse currents are supplied, from the power source (+Vss) (see the member 32 in FIG. 2A or 2C) to a stray capacitance formed, in the substrate 3, at the junction of the transistors $Q_{p2}$ and $Q_{n2}$, on one hand, via the conductor 31, which is substantially the same as the conductor 31 shown in FIGS. 2A, 2B and 2C, and, on the other hand, via a path in the substrate 3. The path is schematically represented by a resistive component R. It should be noted that the resistive path R of FIG. 1 corresponds to a resistive path R of the noise source 33 shown in FIG. 2C. When said spike pulse currents flow through this resistive path R, a spike pulse voltage appears across the path R in synchrony with the occurrence of the spike pulse current. The spike pulse voltage is schematically illustrated as a voltage generator G in the noise source 33 in FIG. 2C.

Thus, the voltage generated by the voltage generator G is applied to the area, in the substrate 3, where the transistor $Q_{p2}$ is located.

The inventors have already found, through various kinds of experiments, that the variation of the voltage appearing at a source region of a transistor, causes a much worse effect on this transistor, in view of the electric noise signal, than the variation of the voltage appearing in the substrate. Accordingly, in FIG. 2C, since the noise source 33 is connected not only to the substrate near transistor $Q_{p2}$, via the connection L, but also to the source of $Q_{p2}$, via an electric connection L′, the noise source 33 causes a much worse effect, in view of the electric noise signal, to the transistor $Q_{p2}$.

Figure 3A:
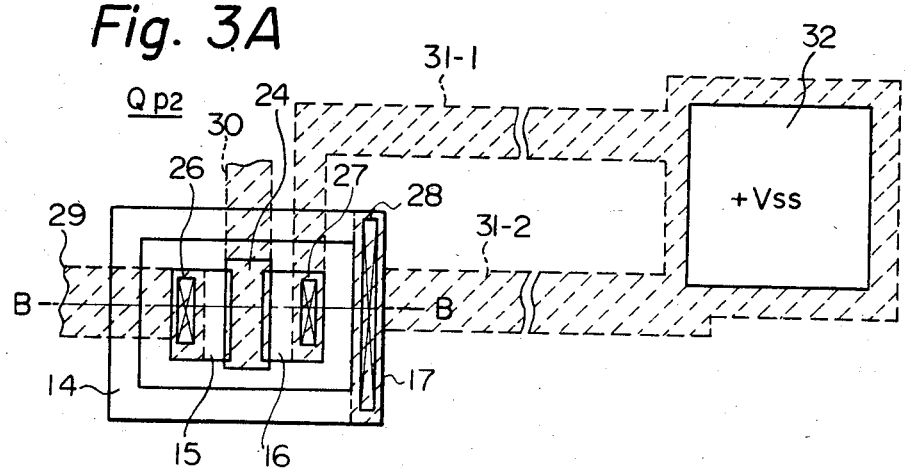
FIG. 3A depicts a plan view of the P-channel transistor $Q_{p2}$ and its peripheral member, improved according to the present invention.
Figure 3B:
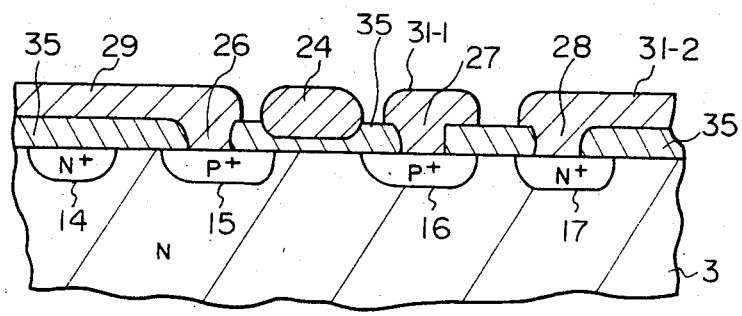
FIG. 3B is a cross-sectional view taken along a line B—B shown in FIG. 3A.
Figure 3C:
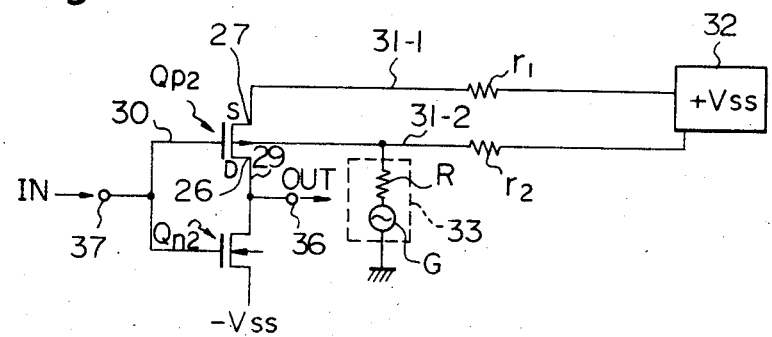
FIG. 3C is an equivalent circuit diagram of members shown in FIG. 3A and the N-channel transistor $Q_{n2}$ shown in FIG. 1.

Contrary to the above, in the present invention, the noise source 33 does not cause a bad effect on the transistor $Q_{p2}$. This is because the noise source 33 is not directly connected to the source of the transistor $Q_{p2}$, as apparent from FIGS. 3A, 3B and 3C. FIG. 3A depicts a plan view of the P-channel transistor $Q_{p2}$ and its peripheral member, improved according to the present invention. FIG. 3B is a cross-sectional view taken along a line B—B shown in FIG. 3A. FIG. 3C is an equivalent circuit diagram of members shown in FIG. 3A and an N-channel transistor $Q_{n2}$ shown in FIG. 1. Referring to these figures, aforesaid conductor 31 is transformed into a first conductor 31-1 and a second conductor 31-2. The first and second conductors 31-1 and 31-2 are physically independent from each other. The symbols $\gamma_1$ and $\gamma_2$ represent resistive components of the first and second conductors 31-1 and 31-2, respectively. Since only the second conductor 31-2 is distributed between the N+-type diffusion region 17 and the bonding pad (+Vss) 32, the aforesaid variation of the voltage appearing in the substrate is applied, not to the source contact window 27, but to the region 17. Accordingly, the noise source 33 is connected only to the conductor 31-2, so that the spike pulse voltage is not applied to the source of the transistor $Q_{p2}$. Consequently, the bad effect, in view of the electric noise signal, to the transistor $Q_{p2}$, is reduced. The function of the first conductor 31-1 is substantially the same as that of the above mentioned conventional conductor 31, however, the first conductor 31-1 does not transmit the undesired spike pulse voltage, as does the conductor 31.

In FIG. 3C, one might assume that, although the undesired spike pulse voltage is not directly applied to the source of the transistor $Q_{p2}$, the undesired spike pulse voltage may be applied thereto via the conductor 31-2, the bonding pad 32 and the first conductor 31-1. However, the above mentioned fact is not true, because, all of the spike pulse voltage signals are absorbed in a capacitor having a large capacitance, which capacitor is usually contained in the power source connected to the bonding pad 32.

Figure 4A:
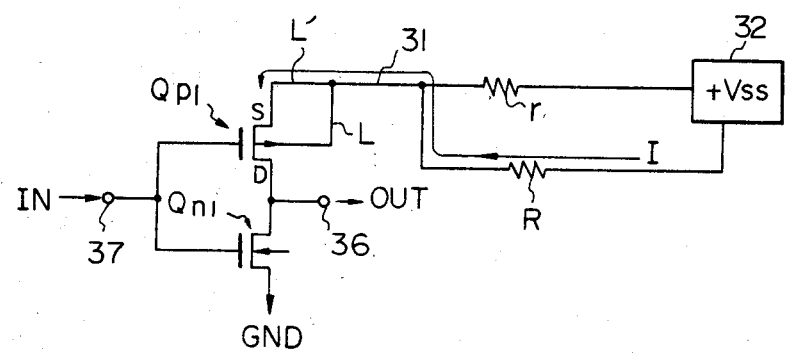
FIG. 4A is an equivalent circuit diagram of an N-channel transistor $Q_{n1}$ and a P-channel transistor $Q_{p1}$ shown in FIG. 1.
Figure 4B:
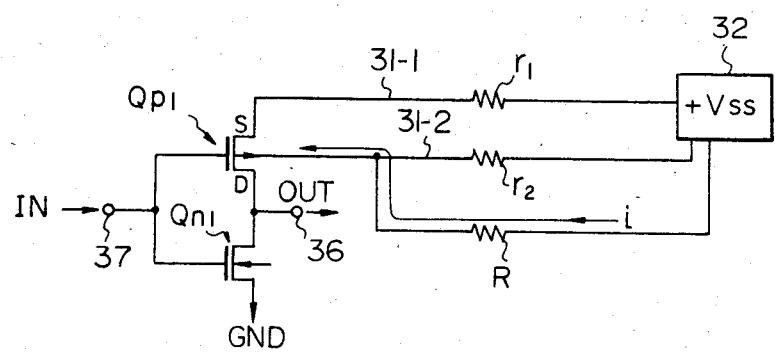
FIG. 4B is an equivalent circuit diagram of the N-channel transistor $Q_{n1}$ and the P-channel transistor $Q_{p1}$, improved according to the present invention.

The first and second conductors 31-1 and 31-2 can also be employed in the CMOS element of the digital circuit area 1 (see FIG. 1). FIG. 4A is an equivalent circuit digram of the N-channel transistor $Q_{n1}$ and the P-channel transistor $Q_{p1}$ shown in FIG. 1, and FIG. 4B is an equivalent circuit diagram of the N-channel transistor $Q_{n1}$ and the P-channel transistor $Q_{p1}$, improved according to the present invention. In FIGS. 4A and 4B, the members represented by the same reference numerals and symbols as those of FIGS. 2C and 3C are functionally analogous. As previously mentioned, in FIG. 4A, the spike pulse currents flow, on one hand, via the conductor 31 and, on the other hand, via the resistive path R in the substrate, both from the bonding pad 32 which is common to both the digital circuit area 1 (FIG. 1) and the analogue circuit area 2 (FIG. 1). The resistive path R of FIG. 4A is identical to the resistive path R shown in FIGS. 1, 2C and 3C. As seen from FIG. 4A, since the resistive path R is directly connected to the source of the transistor $Q_{p1}$ via the connection L', the magnitude of the aforesaid spike pulse current I is quite large. Therefore, the aforesaid spike pulse voltage, across the resistive path R is also quite large, and accordingly the voltage generator G (see FIGS. 2C and 3C) acts as a high power voltage generator. Consequently, the electric noise signal, induced in the analogue CMOS elements of the analogue circuit area 2 (FIG. 1), is very strong.

Contrary to the above, as seen from FIG. 4B, since the conductor 31 of FIG. 4A is divided into the first conductor 31-1 and the second conductor 31-2, the resistive path R is not directly connected to the source of the transistor $Q_{p1}$. Accordingly, the magnitude of the spike pulse current i can be considerably reduced. Thus, the voltage generator G does not act as a strong voltage generator, and therefore, the electric noise signal, induced in the analogue circuit area 2 (FIG. 1) can be reduced to about zero.

Thus, the first and second conductors 31-1, 31-2 may be employed not only in the analogue circuit area 2 (FIG. 1), but also in the digital circuit area 1 (FIG. 1). It is best to employ the first and second conductors 31-1, 31-2 in both the digital and analogue circuit areas, simultaneously.

Even though the above mentioned explanation is directed only to the P-channel transistor $Q_{p1}$ and/or the P-channel transistor $Q_{p2}$, it should be understood that first and second conductors, similar to the aforesaid first and second conductors 31-1, 31-2, can also be incorporated with the N-channel transistors $Q_{n1}$ and $Q_{n2}$.

As mentioned above, according to the present invention, a so-called noiseless CMOS device, which contains therein both digital and analog CMOS elements, can be obtained.

We claim:
1. A semiconductor device operatively connected to a semiconductor power source, comprising:
   a semiconductor substrate;
   a digital circuit, formed in said semiconductor substrate, for generating a digital signal, said digital circuit comprising at least one first CMOS (Complementary Metal Oxide Semiconductor) circuit element including a source region and a drain region both formed in said semiconductor substrate, said source region of said at least one first CMOS element operatively connected to said semiconductor power source;
   an analog circuit formed in said semiconductor substrate and connected to said digital circuit through said semiconductor substrate, said analog circuit comprising at least one second CMOS circuit element connected to said first CMOS element through said substrate and including a source region and a drain region both formed in said semiconductor substrate, said source region of said at least one second CMOS element operatively connected to said semiconductor power source;
   a first region, formed in said semiconductor substrate adjacent said at least one first CMOS element, for suppressing latchup and for establishing ohmic contact to said semiconductor substrate;
   a second region, formed in said semiconductor substrate adjacent said at least one second CMOS element, for suppressing latchup and for establishing ohmic contact to said semiconductor substrate; and
   means for suppressing transient electric noise induced in said analog circuit by the digital signal generated by said digital circuit, comprising:
     a first conductor connected between said semiconductor power source and one of the source regions of said at least one first and second CMOS elements; and
     a second conductor connected between said semiconductor power source and the one of said first and second regions formed adjacent the one of said at least one first and second CMOS elements having its source connected to said first conductor, said first and second conductors being physically independent of each other.

2. A device as set forth in claim 1, wherein said first and second conductors are connected to the source of said at least one second CMOS element and to said second region, respectively.

3. A device as set forth in claim 1, wherein said first and second conductors are connected to the source of said at least one first CMOS element and to said first region, respectively.

4. A device as set forth in claim 1, wherein said first and second conductors are employed in each of said digital and analog circuits.

5. A device as set forth in claim 1, wherein the semiconductor power source includes a capacitance for absorbing the transient electric noise.

* * * * *